(12) United States Patent
Tan et al.

(10) Patent No.: US 8,057,968 B2
(45) Date of Patent: Nov. 15, 2011

(54) MASK AND METHOD TO PATTERN CHROMELESS PHASE LITHOGRAPHY CONTACT HOLE

(75) Inventors: Sia Kim Tan, Singapore (SG); Soon Yoeng Tan, Skudai (MY); Qun Ying Lin, Singapore (SG); Huey Ming Chong, Singapore (SG); Liang Choo Hsia, Singapore (SG)

(73) Assignee: Globalfoundries Singapore Pte. Ltd., Singapore (SG)

( * ) Notice: Subject to any disclaimer, the term of this patent is extended or adjusted under 35 U.S.C. 154(b) by 0 days.

(21) Appl. No.: 12/695,167

(22) Filed: Jan. 28, 2010

(65) Prior Publication Data
US 2010/0196805 A1 Aug. 5, 2010

Related U.S. Application Data

(62) Division of application No. 11/028,421, filed on Jan. 3, 2005, now Pat. No. 7,655,388.

(51) Int. Cl.
*G03F 1/00* (2006.01)
(52) U.S. Cl. .......................... 430/5; 430/311; 430/322
(58) Field of Classification Search ............ 430/5, 311, 430/322
See application file for complete search history.

(56) References Cited

U.S. PATENT DOCUMENTS

| | | | |
|---|---|---|---|
| 5,273,850 A | 12/1993 | Lee et al. | |
| 5,308,741 A * | 5/1994 | Kemp | 430/312 |
| 5,397,663 A | 3/1995 | Uesawa et al. | |
| 5,487,963 A | 1/1996 | Sugawara | |
| 5,786,115 A | 7/1998 | Kawabata et al. | |
| 5,863,712 A | 1/1999 | Von Bunau et al. | |
| 6,355,382 B1 * | 3/2002 | Yasuzato et al. | 430/5 |
| 6,376,130 B1 | 4/2002 | Stanton | |
| 6,623,895 B2 | 9/2003 | Chen et al. | |
| 7,312,020 B2 | 12/2007 | Lin et al. | |
| 7,556,891 B2 * | 7/2009 | Tan et al. | 430/5 |
| 2002/0177048 A1 | 11/2002 | Saitoh et al. | |
| 2003/0203291 A1 | 10/2003 | Misaka | |
| 2004/0101765 A1 | 5/2004 | Sivakumar et al. | |
| 2005/0100829 A1 * | 5/2005 | Lin et al. | 430/322 |
| 2006/0088770 A1 * | 4/2006 | Tan et al. | 430/5 |

* cited by examiner

*Primary Examiner* — Mark F Huff
*Assistant Examiner* — Stewart Fraser
(74) *Attorney, Agent, or Firm* — Horizon IP Pte Ltd

(57) ABSTRACT

A method of making a mask is disclosed. The method includes providing a first and a second mask layers and disposing a first phase shift region on the first mask layer. A second phase shift region is disposed on the second mask layer, wherein the first and second phase shift regions are out of phase. A continuous unit cell is formed in the first phase shift region. The unit cell comprises a center section and distinct extension sections. The extension sections are contiguous to and extend outwards from the center section. The distinct extension sections have a same width as the center section. The second phase shift region is adjacent to the unit cell in the first phase shift region.

25 Claims, 11 Drawing Sheets

501 Phase feature added to regulate intensity

MASK AND METHOD TO PATTERN CHROMELESS PHASE LITHOGRAPHY CONTACT HOLE

CROSS-REFERENCE TO RELATED APPLICATION

This application is a divisional application which claims benefit of copending U.S. patent application Ser. No. 11/028,421, filed on Jan. 3, 2005. All disclosures are incorporated herewith by reference.

BACKGROUND OF INVENTION

1) Field of the Invention

This invention relates, in general, to masks used in making semiconductor devices and, more particularly, to making phase shift masks and using phase shift mask and more particularly to chromeless phase shift mask used to form contact hole patterns.

2) Description of the Prior Art

In the manufacturing of semiconductor devices small features or small geometric patterns are created by using conventional optical photolithography. Typically, optical photolithography is achieved by projecting or by transmitting light through a pattern made of optically opaque areas and optically clear areas on a mask. The optically opaque areas of the pattern block the light, thereby casting shadows and creating dark areas, while the optically clear areas allow the light to pass, thereby creating light areas. Once the light areas and dark areas are formed, they are projected onto and through a lens and subsequently onto a photosensitive layer on a semiconductor substrate. However, it should be understood that dimensions can be scaled for use with other reduction tools. Projecting light areas and dark areas on the photosensitive layer results in portions of the photosensitive layer being exposed, while other portions of the photosensitive layer will be unexposed.

However, because of increased semiconductor device complexity, which results in increased pattern complexity, increased resolution demands, and increased pattern packing density on the mask, distance between any two opaque areas has decreased. By decreasing the distances between the opaque areas, small apertures are formed which diffract the light that passes through the apertures. The diffracted light results in effects that tend to spread or to bend the light as it passes so that the space between the two opaque areas is not resolved, therefore making diffraction a severe limiting factor for conventional optical photolithography.

A method for dealing with diffraction effects in conventional optical photolithography is achieved by using a chromeless phase shift mask, which replaces the previously discussed mask. Generally, with light being thought of as a wave, phase shifting with a chromeless phase shift mask is achieved by effecting a change in timing or by effecting a shift in waveform of a regular sinusoidal pattern of light waves that propagate through a transparent material. Typically, phase shifting is achieved by passing light through areas of a transparent material of either differing thicknesses or through materials with different refractive indexes, thereby changing the phase or the period pattern of the light wave.

Chromeless phase shift masks reduce diffraction effects by combining both phase shifted light and non-phase shifted light so that constructive and destructive interference takes place. Generally, a summation of constructive and destructive interference of phase shift masks results in improved resolution and in improved depth of focus of a projected image of an optical system.

Relevant patents include the following:

U.S. Pat. No. 6,376,130—Stanton—Chromeless alternating reticle for producing semiconductor device features—An alternating phase shift reticle for a capacitor layout scheme for a memory device and a method for its fabrication is disclosed. The alternating phase shift mask has regions of 0 and 180 degree phase shifts arranged in a way such that all sides of each region corresponding to a given phase shift value are bounded by areas corresponding to an opposite phase shift value.

U.S. Pat. No. 6,623,895—Chen, et al.—shows a Hybrid phase shift mask—The method includes the steps of forming at least one non-critical feature on the mask utilizing one of a low-transmission phase shift mask (pattern) and a non-phase shifting mask (pattern), and forming at least one critical feature on the mask utilizing a high-transmission phase shift mask (pattern).

U.S. Pat. No. 5,863,712 Von Bunau, et al.—Pattern forming method, projection exposure system, and semiconductor device fabrication method.

U.S. Pat. No. 5,786,115—Kawabata, et al.—Mask producing method.

SUMMARY OF THE INVENTION

Embodiments of the present invention provide structure and a method of fabrication a chromeless phase shift mask which is characterized as follows.

An example embodiment is a phase shift mask comprised of: a mask comprised of a first phase shift region and a second phase shift region; the first phase shift region and the second phase shift region are about 180 degrees out of phase;

the first phase shift region is comprised of at least a unit cell; the unit cell is comprised of (a) a center section and (b) at least three rectangular sections extending outwards from the center section; the center section has a rectangular shape;

the second phase shift region is adjacent to the first region;

the unit cell has a shape that when light passes through the mask, the destructive interference between the first phase shift region and a second phase shift region creates a contact hole pattern.

An example embodiment is a chromeless phase shift mask comprised of: a mask comprised of a first phase shift region and a second phase shift region; the first phase shift region and the second phase shift region are about 180 degrees out of phase;

the first phase shift region is comprised of unit cells, each unit cell comprised of (1) an center section and (2) four rectangular sections extending outwards from the center section; the center section has a rectangular shape; the unit cells are connected by adjacent rectangular sections to form a plurality of rows and columns;

the second phase shift region is adjacent to the first region;

whereby when light passes through the mask, the destructive interference between the first phase shift region and a second phase shift region creates a contact hole pattern.

An example embodiment is a method for projecting patterns onto a semiconductor substrate comprising: providing an illumination source;

providing a phase shift mask that has a first phase shift region and a second phase shift region; the first phase shift region and the second phase shift region are about 180 degree out of phase;

the first region comprised of a unit cell; the unit cell comprised of (a) a center section and (b) at least three rectangular sections extending outwards from the center section; the center section has a rectangular shape; the unit cell has a shape that when light passes through the mask, the destructive interference between the first phase shift region and a second phase shift region creates a contact hole pattern;

projecting light from the illumination source through the phase shift mask onto a semiconductor substrate.

The above and below advantages and features are of representative embodiments only, and are not exhaustive and/or exclusive. They are presented only to assist in understanding the invention. It should be understood that they are not representative of all the inventions defined by the claims, to be considered limitations on the invention as defined by the claims, or limitations on equivalents to the claims. For instance, some of these advantages may be mutually contradictory, in that they cannot be simultaneously present in a single embodiment. Similarly, some advantages are applicable to one aspect of the invention, and inapplicable to others. Furthermore, certain aspects of the claimed invention have not been discussed herein. However, no inference should be drawn regarding those discussed herein relative to those not discussed herein other than for purposes of space and reducing repetition. Thus, this summary of features and advantages should not be considered dispositive in determining equivalence. Additional features and advantages of the invention will become apparent in the following description, from the drawings, and from the claims.

BRIEF DESCRIPTION OF THE DRAWINGS

The features and advantages of a mask according to the embodiments of the present invention and further details of a process of fabricating such a mask and devices with the mask in accordance with the embodiments of the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

The present invention will be described in detail with reference to the accompanying drawings. The embodiments of the present invention provides a structure and a method of forming a chromeless mask pattern used to define contact holes. Other embodiments provide a method of using the mask.

Figure 1:
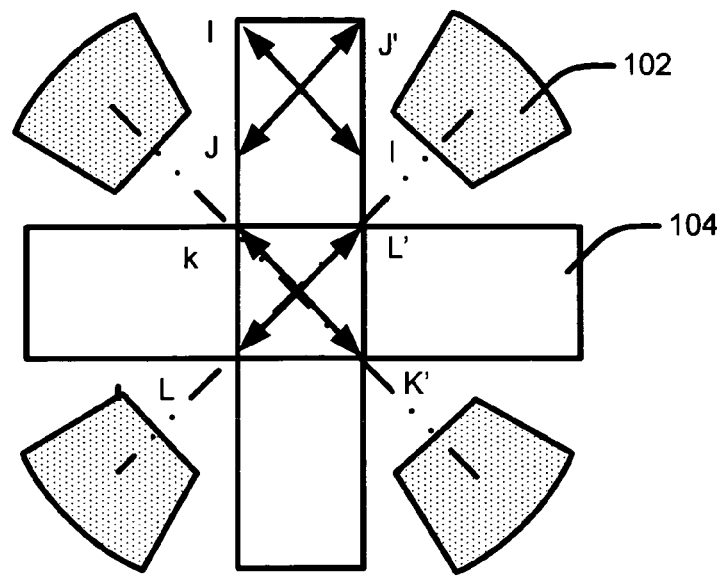
FIG. 1 shows a representation of an embodiment of the mask having a first (e.g., 180 degree) phase shift region 104 (cross-junction feature) that has a cross shape.

FIG. 1 shows a representation of an embodiment of the mask having a first (e.g., 180 degree) phase shift region 104 (cross-junction feature) that has a cross shape. The mask is preferably the chromeless type. The quasar illumination fields 102 are superimposed over the mask areas for illustration purposes.

We illuminate the embodiment's chromeless mask with a cross-junction feature using quasar illumination, to form a (contact) hole feature in the photo resist at the center of the cross-junction of two phase lines. This is because unlike other area, there are no neighboring phase edges to create the destructive interference. This structure can be used in the chromeless phase lithography to define contact holes.

FIG. 1 shows the quasar illumination 102, and the first (e.g., 180 degree) phase shift region 104 of a phase shift mask (PSM). No edges at axis K-K' and axis L-L' interference at a certain first dimension result in a hole formation.

The "certain first dimension" can be determined by computer simulation. Illuminating parameters, such as wavelength, partial coherency, illuminating sector angle and type of off-axis illuminations, will affect the required edges separation dimension for formation of the contact hole. For example, with a 248 nm wavelength, numerical aperture setting 0.80 quasar illumination, outer partial coherency factor of 0.55 and inner partial coherency factor of 0.30 at 30 deg illuminating sector, the required dimension for a hole formation is about and more than (70×4) nm on mask as with used on a projection system magnification of 4 times.

A. Example Embodiment of a Phase Shifting Mask

Figure 2A:
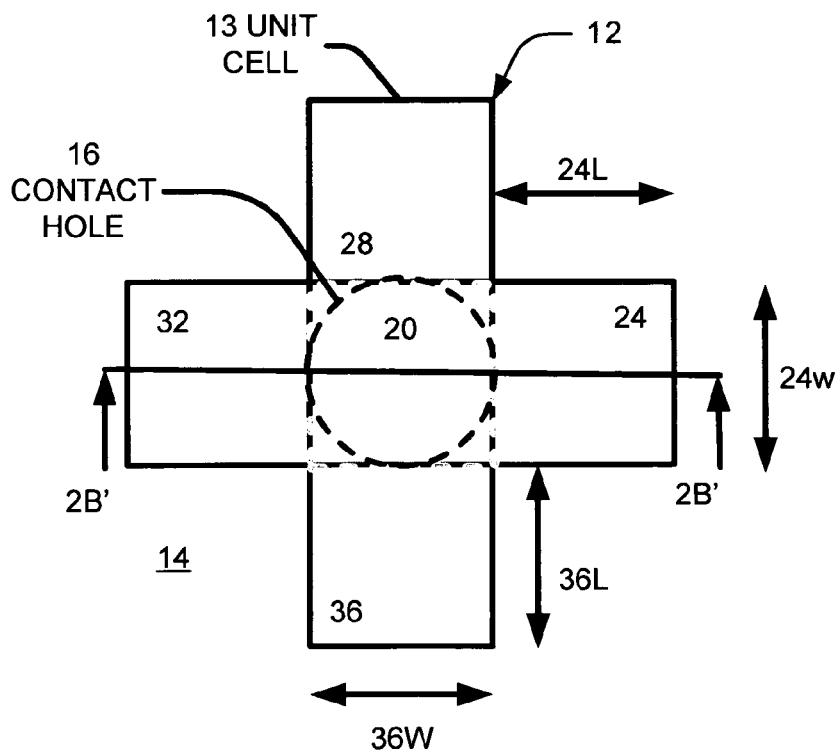
FIG. 2A shows a top down view of a PSM of an embodiment of the invention.
Figure 2B:
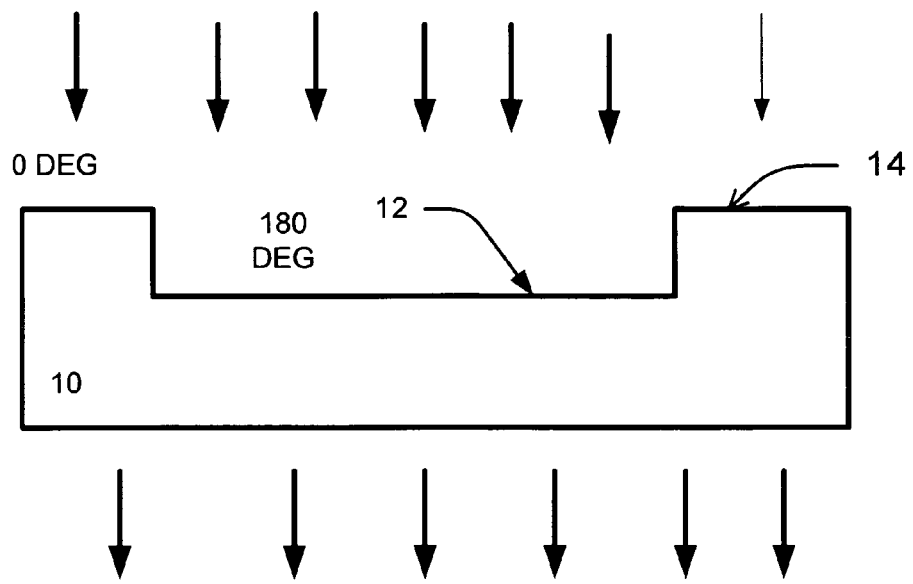
FIG. 2B shows a cross sectional view through a first region 12 in FIG. 2A.

FIG. 2A shows a top down view of a PSM of an embodiment of the invention. FIG. 2B shows a cross sectional view through a first region 12 in FIG. 2A.

The chromeless PSM mask (e.g., mask substrate) 10 preferably comprises a first phase shift region 12 and a second phase shift region 14. The first and second phase shift regions are preferably about 180 degrees out of phase. For example, the first region 12 of 180 degree phase shift and a second region 14 has a 0 degree phase shift, or viscera.

The first phase shift region is preferably comprised of a unit cell. As shown in FIG. 2A, the unit cell 13 (24 20 32 28 36) preferably has an orthogonal cross shape with a rectangular center section 20 (see dashed center rectangle) and preferably four (legs) rectangular sections 24 28 32 36 preferably connected to and outwards extending from the rectangular center (middle) section 20. In an option shown FIG. 3C, the unit cell can be comprised of 3 rectangular sections. Unit cells can also be joined together as show in The center section 20 can also be a rectangle or other shape and is not restricted to a square. As the roundness of the (circular contact hole light) shape and displacement are affected by proximity structures, hence optical proximity correction process may change the original square shape to rectangle depending on the effect of neighboring structures. If the proximity lights that influence the resultant intensity at the center location are all equal, then the center section (20) is a square. In other embodiments, the center section could take the shape of a rectangle to correct the influence from the proximate lights.

The second region 14 is adjacent to the first region 12.

The sidewall of the trench that where region 12 and region 14 transit should be ideally or as close to 90 deg as possible. The depth of the trench depends on the wavelength, such that it generate an optical path difference of 180 deg. The minimum width dimension that can be manufactured to-date is about 200 nm, but not restricted to that dimension with the technology advancement. As mentioned in previous section answer, the dimension is limited by the illumination parameters.

FIG. 2B shows an example cross sectional view through the horizontal leg 32 20 24 of the first region 12 in FIG. 2A in the mask or substrate 10. The mask can be a conventional phase shift substrate comprised of, for example, quartz, silica glass or borosilicate glass. The mask can have trenches or raised areas to define the first and second phase shift regions.

Figure 4:
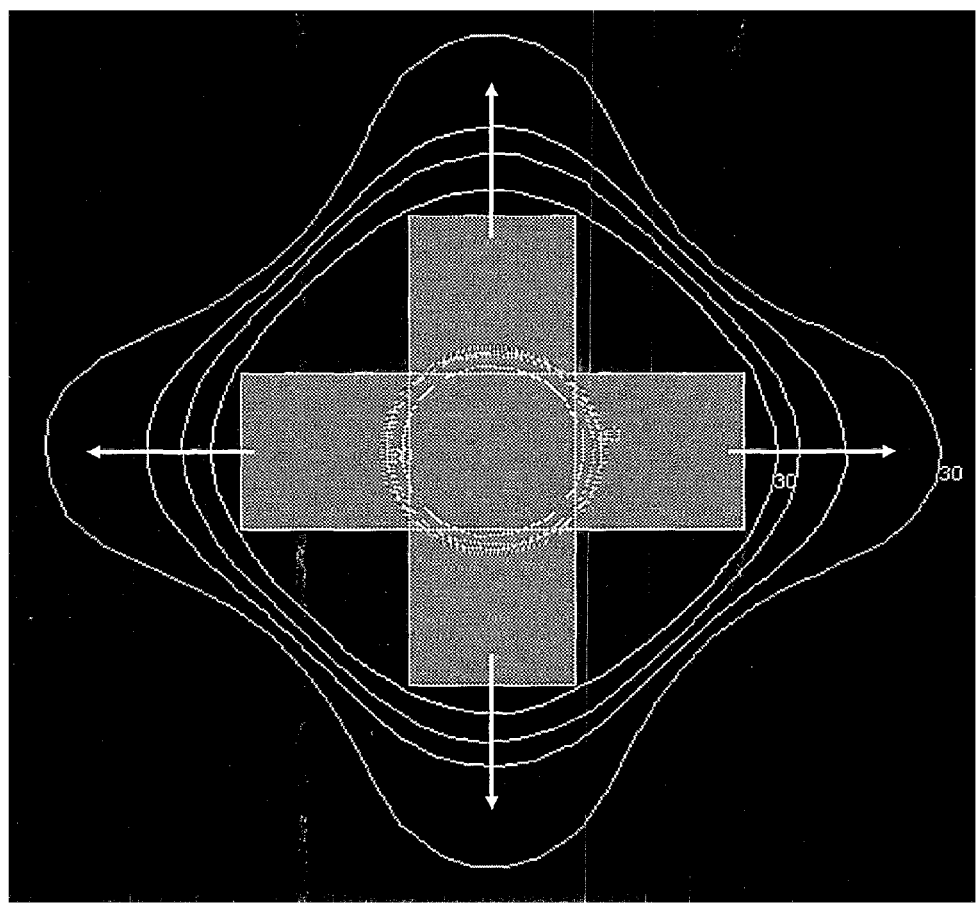
FIG. 4 shows a simulation of the contact hole projection of increasing lengths of rectangular sections of an example embodiment of the invention.

Contact hole 16 (to be imaged on the resist layer) is located assigned as a (180 degrees) phase shift layer 12. All the orthogonal rectangular sections (legs) 24 28 32 36 are extended such that the resulting intensity will produce a hole 16 in the center of the line (in the resist) as shown in FIG. 2A. For sub-wavelength size contact hole projections, the dimension width of the line/legs should be less than half the illuminating wavelength and low inner and outer sigma factor should be used. Fine tuning can be achieve with the edge movement as shown in FIG. 4.

For illustration, a quasar 30 deg illumination angle, Wavelength=0.248 um, NA=0.80, sigma inner of 0.30 and sigma outer of 0.55.

In general, for initial parameter assignment (before proximity correction), $L_1$ is approximately equal to $W_1$. $D_1$ should also preferably be equal to $W_1$ for ease of designing the layout.

Figure 3A:
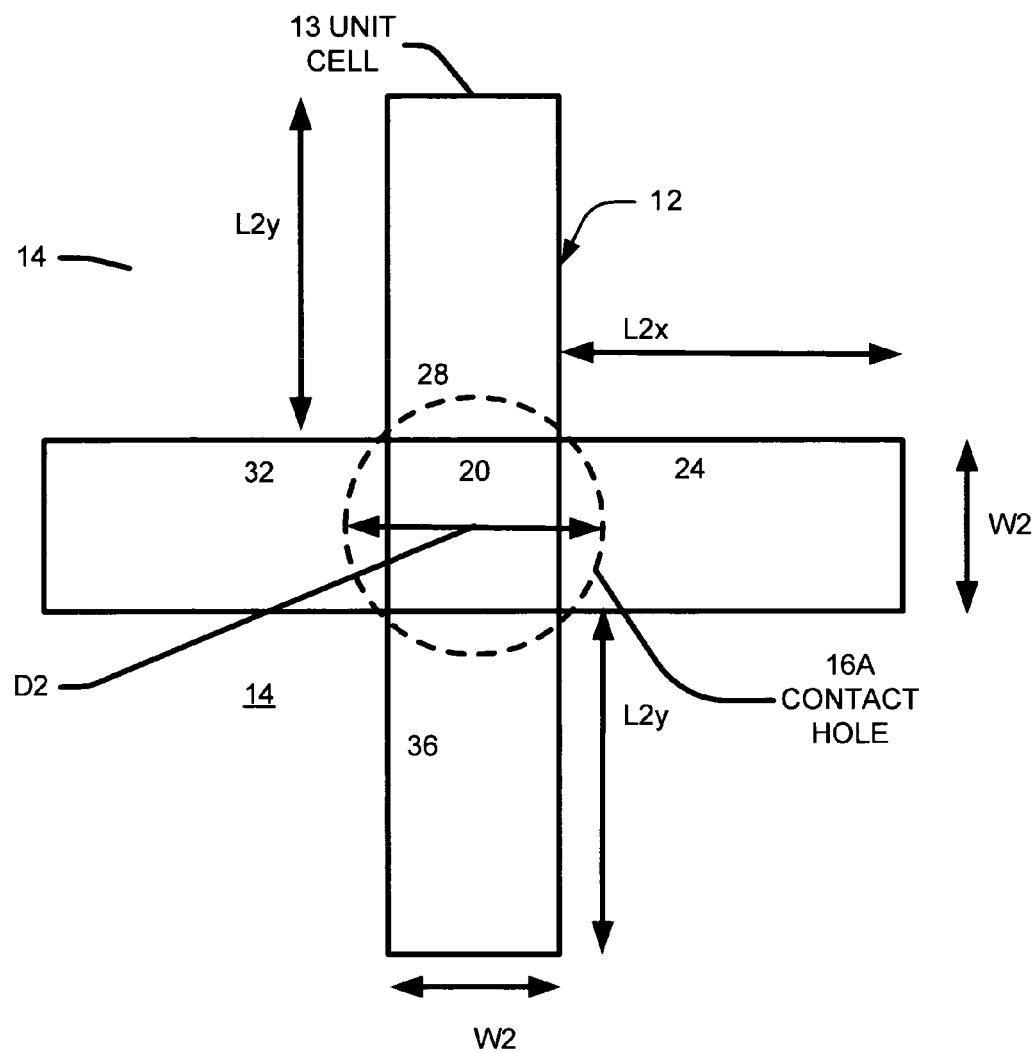
FIGS. 3A and 3B show top plan representation of embodiments of the unit cell with the different length and width rectangular sections.
Figure 3B:
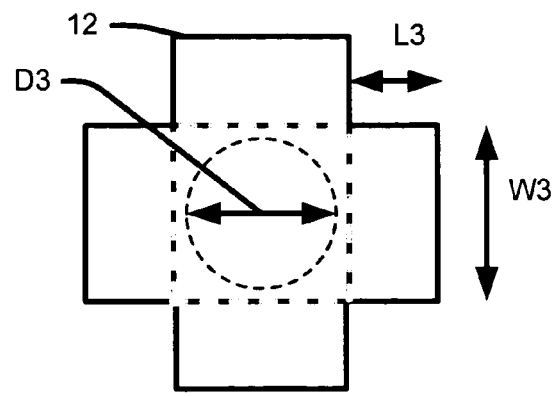
Figure 3C:
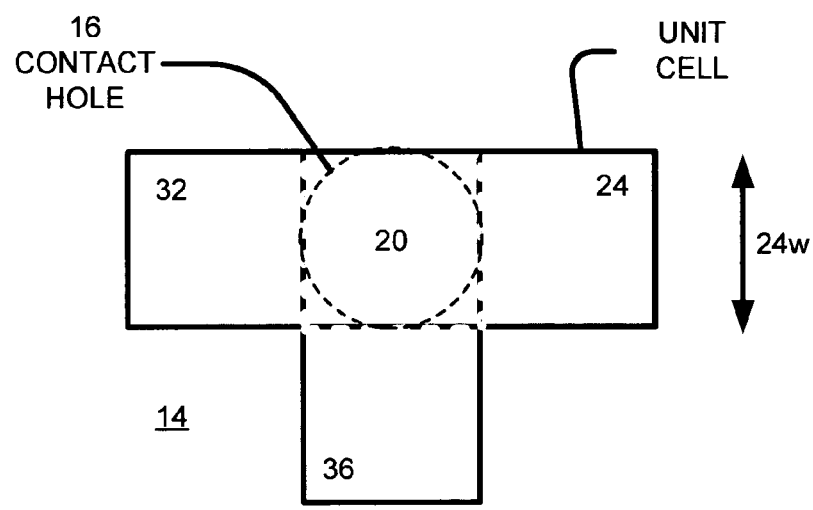
FIG. 3C shows a unit cell with rectangular sections according to example embodiment of the invention.

B. Embodiments of the Unit Cell with the Different Length and Width Rectangular Sections FIGS. 3A and 3B show embodiments of the unit cell with the different length and width rectangular sections (legs). FIG. 3A shows the length L2x L2y of the rectangular sections and W2 widths of the rectangular sections. As the rectangular section length (L) increases, the diameter of the projected contact hole ($D_2$) increase. However, the relationship is non-linear. The size of $D_x$ will saturate at even thought $L_x$ increases.

FIG. 3A shows a cross with the legs about twice as long as in FIG. 2A.

Using the above-mention illuminating parameters for illustration, L is length of rectangular section, W is width of rectangular section, D is diameter of projected hole, the length of a side of the center section is also, W.

1. $L_1$=$W_1$=0.100 um, $D_1$=0.125 um.
2. $L_2$=0.150 um, $W_2$=0.100 um, $D_2$=0.137 um.
3. $L_3$=0.200 um, $W_3$=0.100 um, $D_3$=0.144 um.
4. $L_4$=0.300 um, $W_4$=0.100 um, $D_4$=0.146 um.
5. $L_5$=0.050 um, $W_5$=0.100 um, $D_5$=0.00 um.
6. $L_6$=0.130 um, $W_6$=0.100 um, $D_6$=0.135 um.
FIG. 3B

As shown in FIG. 3B, if the legs $L_3$ get shorter than the leg's "critical dimension" of 0.07 um when W is 0.100 um, hence no contact hole is formed for any smaller dimension. However, if $L_3$ is decreases, the general trend is a decrease in $D_3$. From the illustration,
1. $L_3$=0.4$W_3$=0.040 um, $W_3$=0.100 um, $D_3$=0.00 um.
2. $L_4$=0.7$W_4$=0.070 um, $W_4$=0.100 um, $D_4$=0.034 um.
3. $L_5$=0.8$W_5$=0.080 um, $W_5$=0.100 um, $D_5$=0.088 um.

C. Simulation of the Contact Hole Projection

FIG. 4 shows a simulation of the contact hole projection of increasing lengths of rectangular sections. FIG. 4 shows that as the legs get longer, the hole gets bigger till it saturates at a dimension dependent on the illumination.

Referring to FIG. 4, the lines around the outside shows the computer simulated resist boundary at an intensity threshold of 0.30. The region outside the boundary indicates the resist is exposed and will be develop and rinse away during the developing cycle.

D. Dense Array Contact Pattern

Figure 4A:
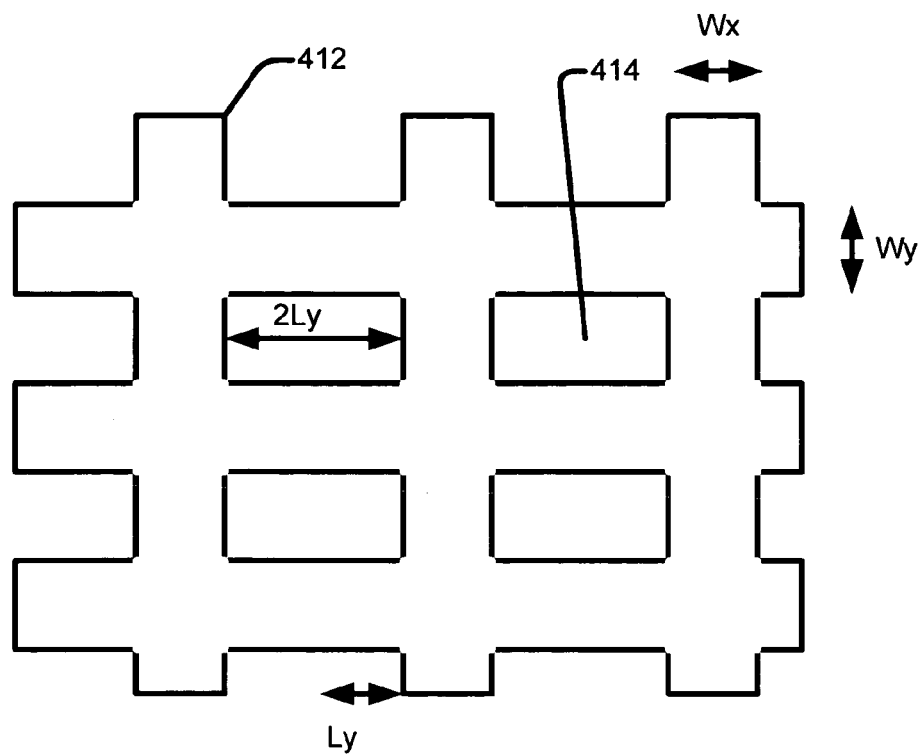
FIG. 4A shows top plan view of a dense array (rows and columns) contact pattern according to an example embodiment of the invention.
Figure 4B:
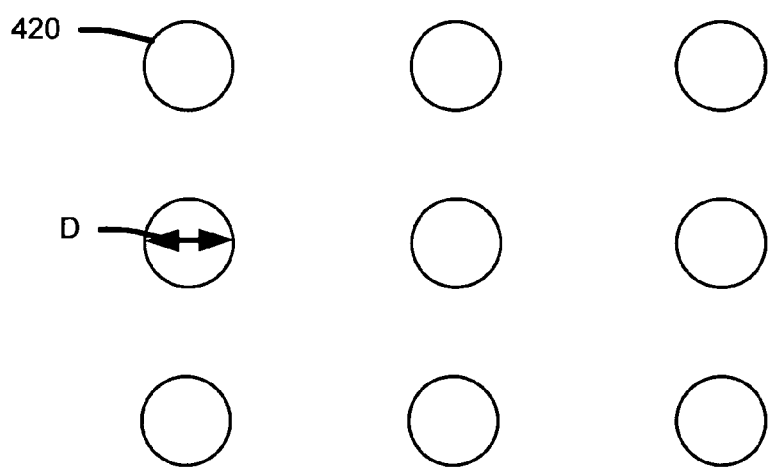
FIG. 4B is a top down view of the resulting contact hole pattern from the mask in FIG. 4A that is projected onto photo resist according to example embodiment of the invention.

FIGS. 4A and 4B, show a dense array (rows and columns) contact pattern. FIG. 4A is a top down view of the mask and first phase shift region 412 (e.g., 180 degree phase shift region) comprised of unit cells and second phase shift region 414 (e.g., unshifted regions). FIG. 4B is a top down view of the resulting contact hole pattern that is projected onto photo resist. If Wx is equal to Wy, then 2*Ly should be greater than Wx. 2*Ly should then be approximately greater by at least 1.4 times of Wx. This is because at close proximity, such that 2*Ly is less than 1.4 times of Wx, all the edges will interfere and no contact hole can be formed.

FIG. 4B shows the resulting contact hole pattern in the photo resist. D is the diameter of the contact hole pattern 420.

Figure 4C:
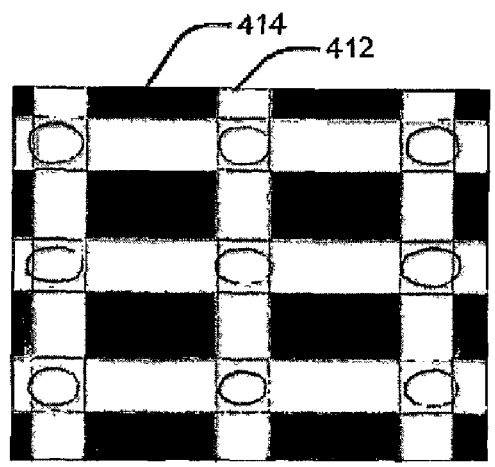
FIG. 4C shows a top down image view of a chromes less PSM with a Dense array contact similar to that shown in FIG. 4A.

FIG. 4C shows a top down image view of a chromes less PSM with a Dense array contact similar to that shown in FIG. 4A.

E. Example Embodiment of Chromes Less PSM

Figure 5A:
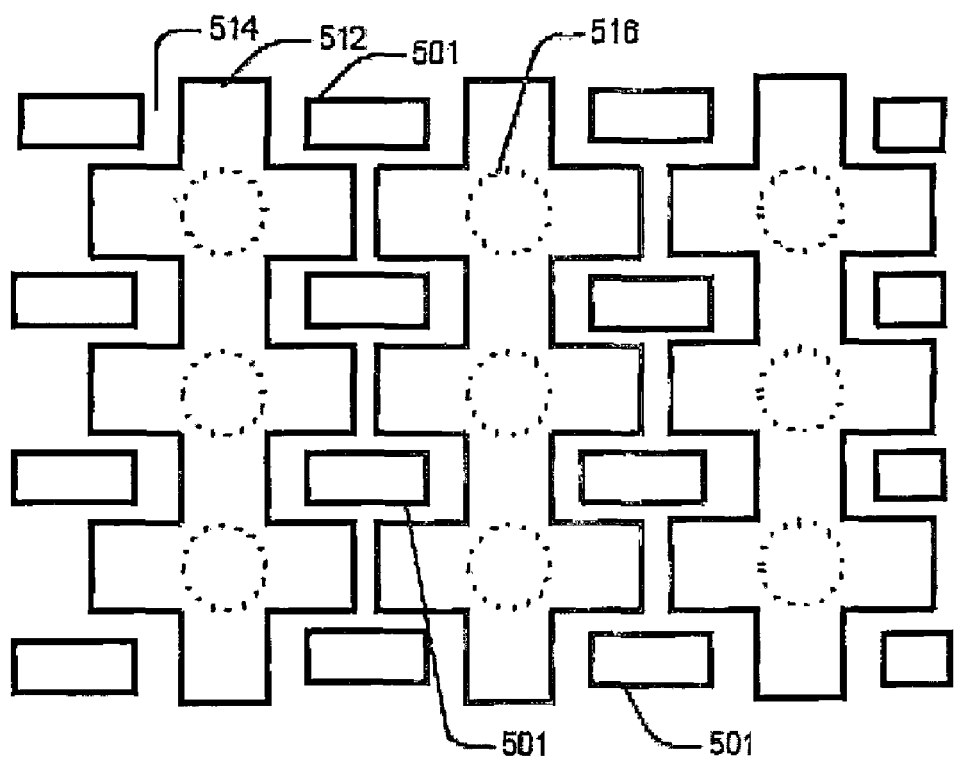
FIGS. 5A and 5B show a top down views of an embodiment of a chromeless PSM with a dense (simulated) contact hole array 516.
Figure 5B:
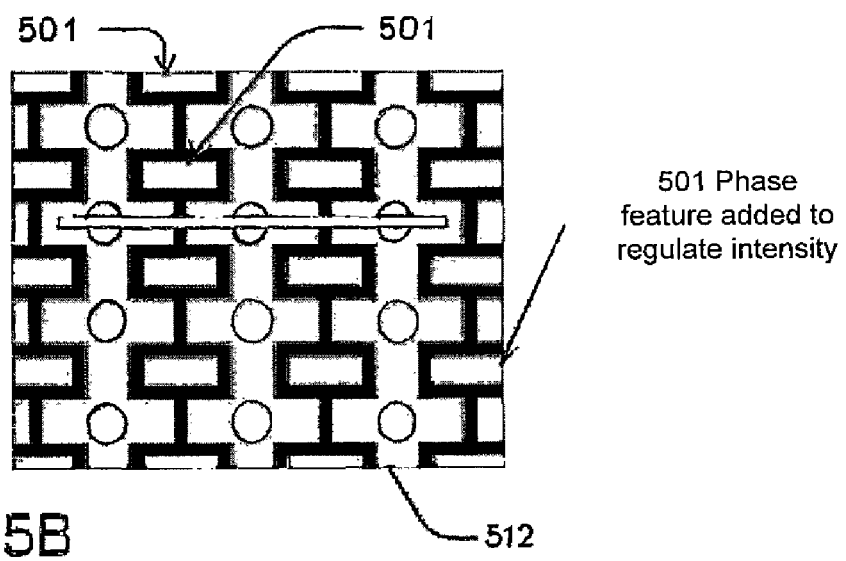

FIGS. 5A and 5B show a top down views of an embodiment of a chromeless PSM with a dense (simulated) contact hole array 516 can be patterned using the unit cells 512 (e.g., 180 degree shift regions) with novel phase regulator features 501 added to regulate the intensity. The non-patterned regions 514 preferably have about 180 a phase shift compared to the unit cells 512 and phase regulator feature 501. FIG. 5A shows at least two columns 512 comprised of unit cells; the two columns are spaced apart; a regulator feature 501 between the two columns.

FIG. 5A is a schematic top down view. FIG. 5B is a photographic top down views of an embodiment of a chromeless PSM with a dense array contact can be pattern with novel phase regulator features 501 added to regulate the intensity.

Phase regulator feature 501 is to create destructive interference at the background region where there is no contact hole feature present. The edge of the (unit cell(s) 512) cross legs will interfere with the nearest edge of the phase feature 501. The width of the phase regulator feature is between 1 to 2 times the width of the cross feature (unit cell) used. It is placed with a spacing of at least 0.5 times the width of the (unit cell) cross feature used and more preferably about 0.5 time the width of the center section of the unit cell. Strips of phase feature 501 can be used at spacing of the cross feature width for large background region. Else a chrome feature could be used to cover the background region.

Figure 6:
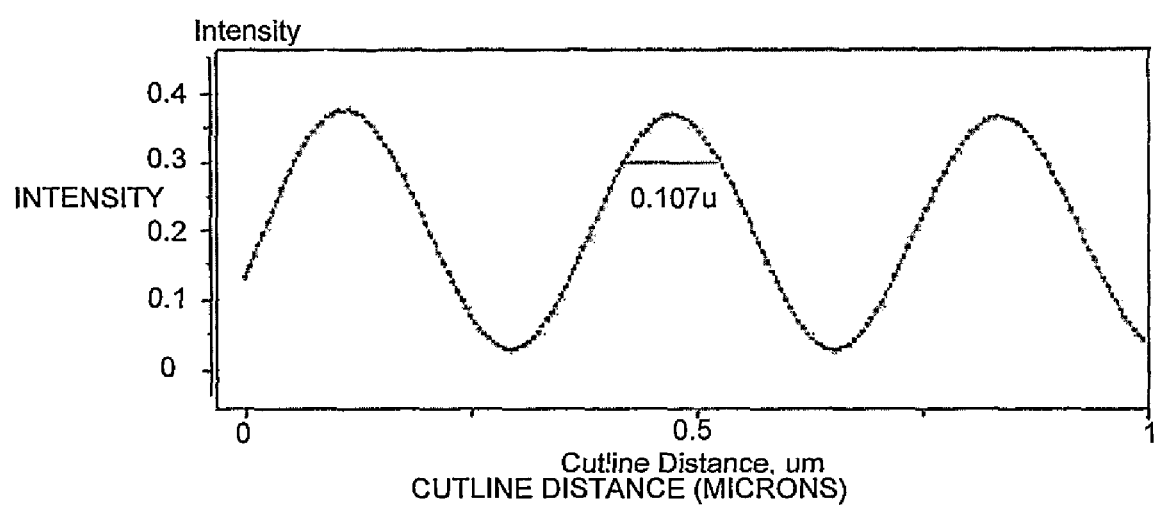
FIG. 6 shows a graph of the Intensity across section (white line) in FIG. 5B according to example embodiment of the invention.

FIG. 6 shows the Intensity across section (white line) in FIG. 5B. Using the illustrated illumination condition, subwavelength contact hole with dimension of about 0.107 μm can be patterned using 248 nm-wavelength source photolithography with this embodiment.

F. Example Chromeless Mask with a Column of Misaligned Contact Holes

Figure 7A:
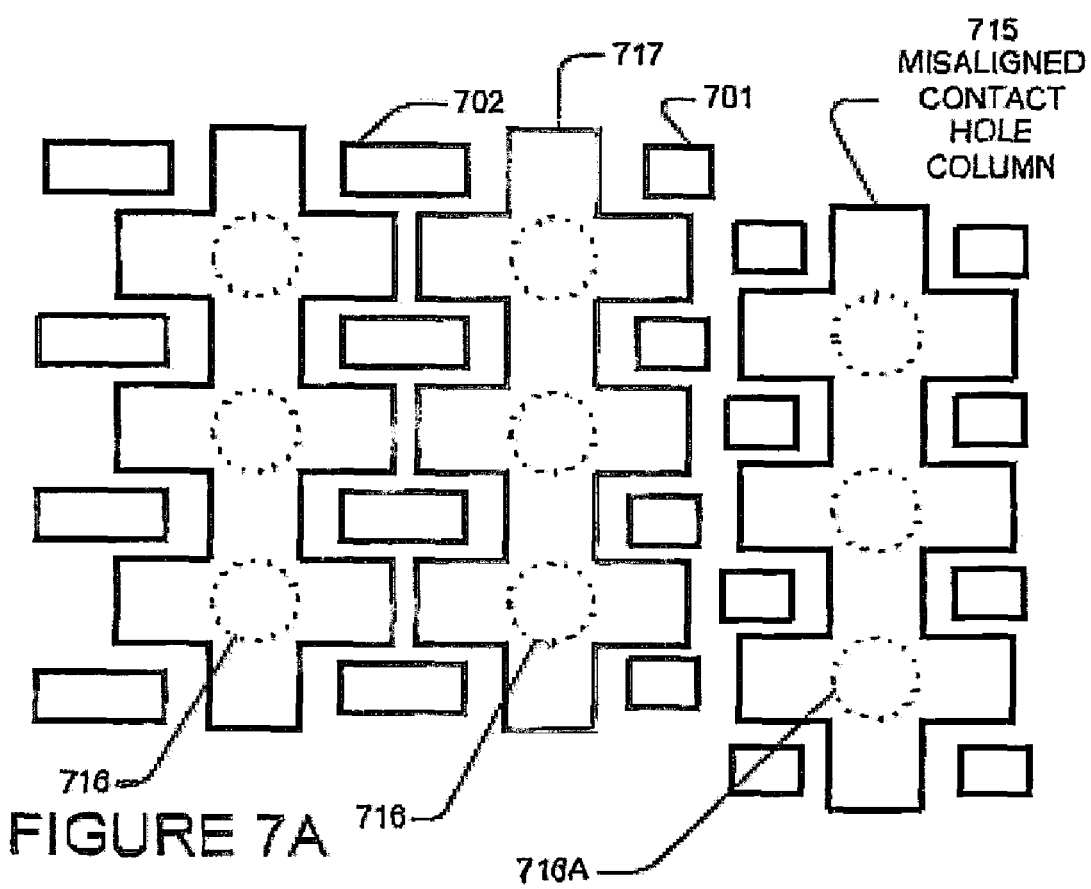
FIG. 7A is a top down view and FIG. 7B is an image of a chromeless mask that shows a column 715 of misaligned contact holes 716A according to example embodiment of the invention.
Figure 7B:
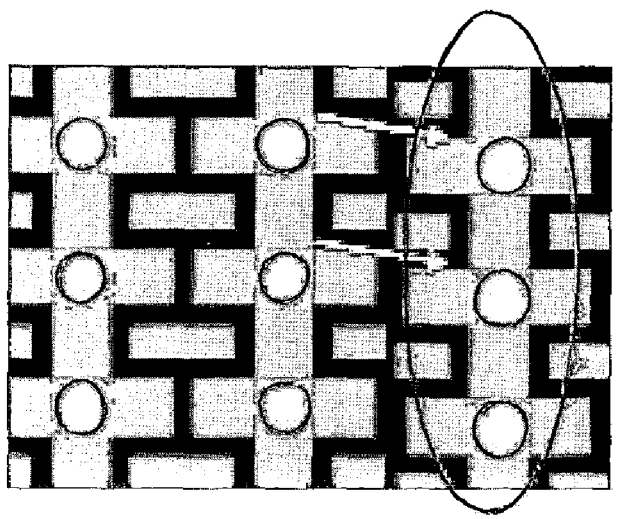

FIG. 7A is an top down view of a chromeless mask that shows a column 715 of misaligned contact holes 716A. FIG. 7A shows aligned contact holes columns 717 of aligned (simulated) contact holes 716. FIG. 7B is an image of a chromeless mask that shows a misaligned contact hole. In normal circuit layout, not all holes are neatly arranged in array. In some instance, misalignment/skewing of a block of array of hole can occur. This embodiment can also handle such cases using the same cross shape approach. FIGS. 7A and 7B show the embodiments "regulator phase features" 701 and 702 added to achieve the correct contact hole pattern.

FIG. 7A shows at least two columns comprised of unit cells; the two columns are spaced apart and mis-aligned in an x or y direction; at least a regulator feature between the two columns.

G. Contact Pattern with "Regulator Phase Feature"

Figure 8A:
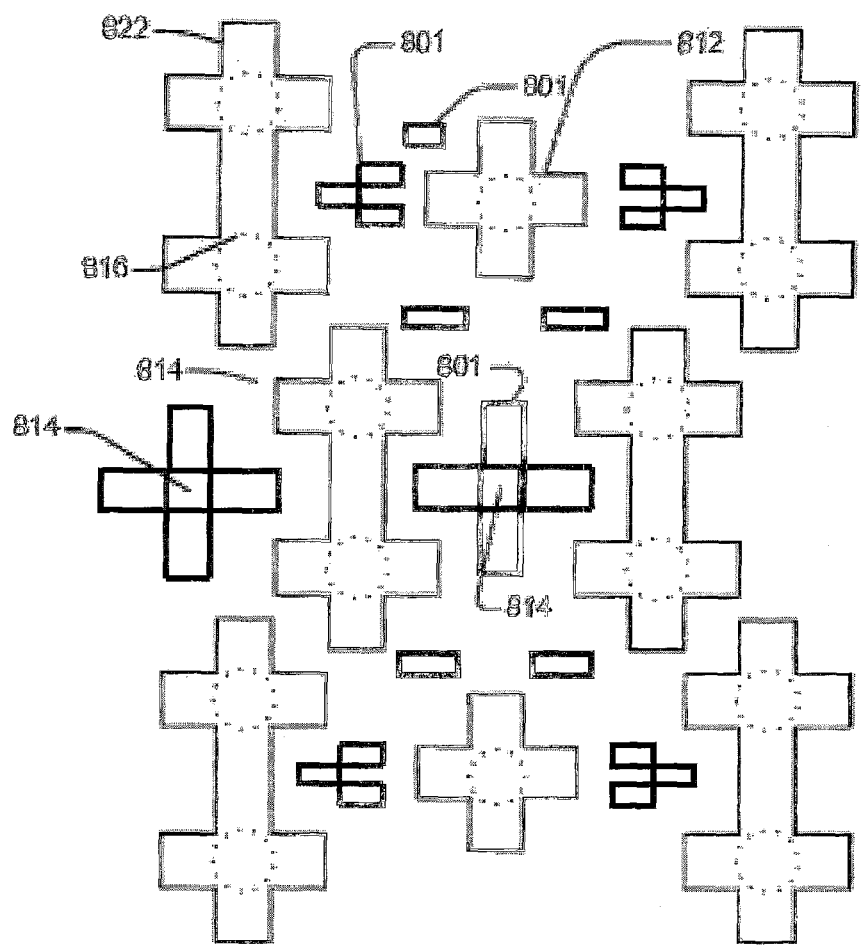
FIG. 8A shows top down view and FIG. 8B shows a top down image of a mask with first phase shift regions comprised of unit cells in a random contact pattern with "regulator phase feature" 801 added to regulate the intensity according to example embodiment of the invention.
Figure 8B:
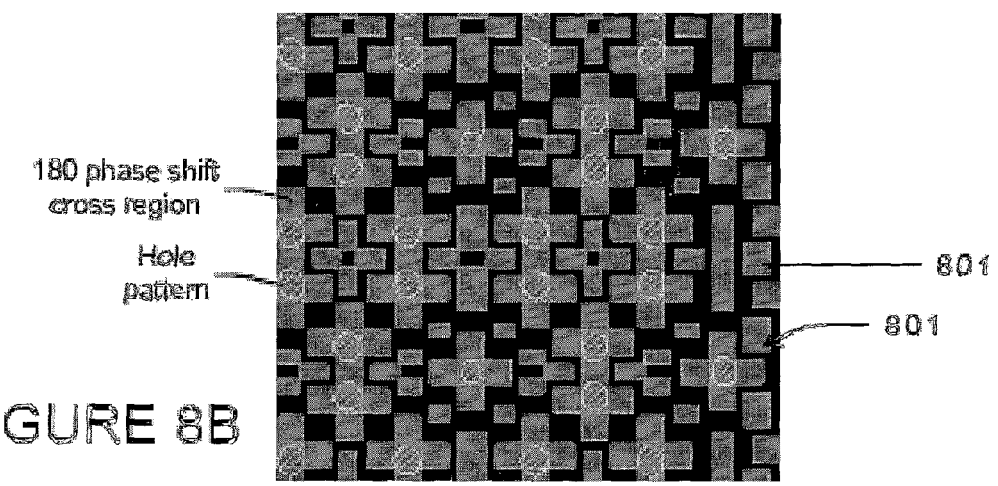

FIG. 8A shows top down view of a mask with first phase shift regions comprised of unit cells 801 in a random contact pattern with "regulator phase feature" 801 added to regulate the intensity. FIG. 8B is a top down image of a mask with first phase shift regions comprised of unit cells in a random (simulated) Contact hole 816 pattern with "regulator phase feature" 801 added to regulate the intensity. The BLACK background is 180 deg phase shifted quartz, all the Grey blocks are 0 deg phase shifted quartz "phase features". The WHITE features are the simulated contact hole opening. They appeared displaced from the contact location and vary in sizes, as no proximity correction is done with this illustration.

FIG. 8A shows the first region comprised of a double cell 822 comprised of at least two unit cells are joined and at least a first separate unit cell 812. The double cell 822 and the first unit cell 812 are separated by at least a regulator feature (814 or 801)

H. Method to Use the Mask to Expose a Wafer

Figure 9:
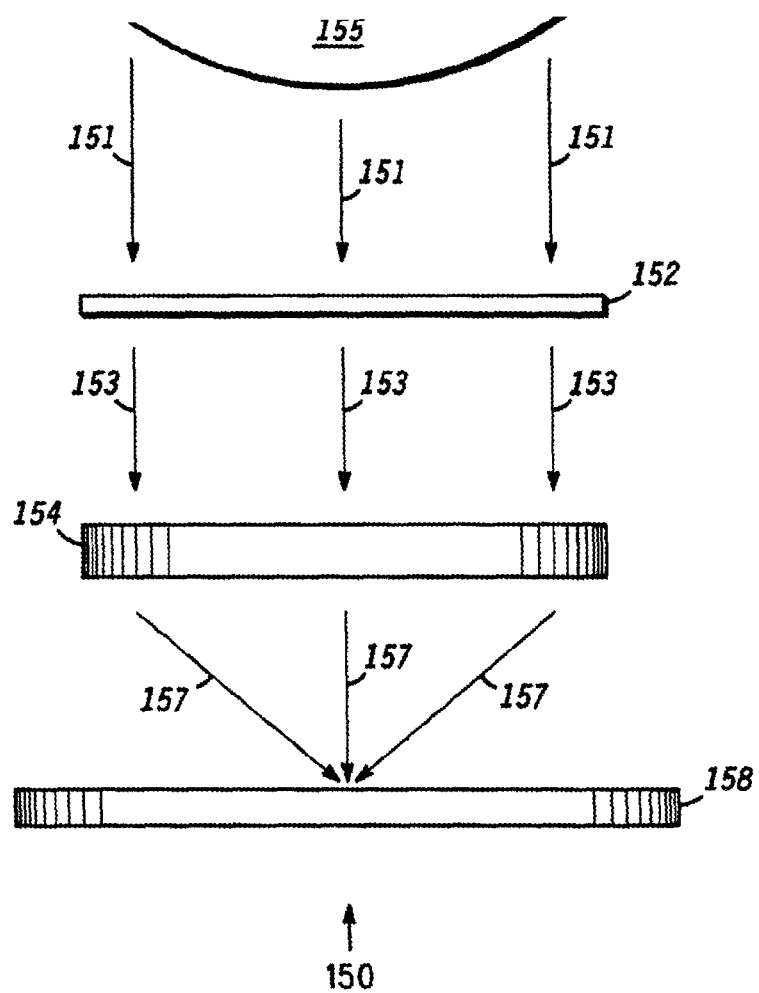
FIG. 9 pictorially illustrates an optical system 150 that uses a chromeless phase shift mask of an embodiment of the present invention.

FIG. 9 pictorially illustrates an optical system 150 that uses a chromeless phase shift mask of an embodiment of the present invention. Generally, illumination source 155 is a lamp which emits commonly used frequencies, such as i-line (365 nanometers). However, other sources of illumination can be used, such as excimer laser with wavelength of 248 nm, 193 nm and 157 nm. Arrows 151 illustrate illumination that is directed from illumination source 155 towards a chromeless phase shift mask 152 which can be mask 10. The illumination, that is depicted by arrows 151, then passes through chromeless phase shift mask 152, where the illumination wave form changes. Arrows 153 illustrate the effective illumination after passing through chromeless phase shift mask 152. Illumination depicted by arrows 153 falls on a lens 154. Numerical aperture of lens 154, generally, ranges between values of 0.5 to 0.85. However, it should be understood that numerical aperture is a physical attribute of the lens optics, and numerical aperture will improve or approach a theoretical limit as lens optics improves, e.g., numerical aperture will approach 1.0. With immersion lithography the numerical aperture can be up to 1.44, depending on the refractive index of the medium. Typically, lens 154 is a reduction lens which reduces an image that is made by phase shift mask 152. This reduced image is projected onto a surface of a semiconductor substrate 158. Arrows 157 represent the projection of the reduced image from lens 154 to semiconductor substrate 158.

I. Non-Limiting Embodiments

In the above description numerous specific details are set forth such as flow rates, pressure settings, thicknesses, etc., in order to provide a more thorough understanding of the present invention. It will be obvious, however, to one skilled in the art that the present invention may be practiced without these details. In other instances, well known process have not been described in detail in order to not unnecessarily obscure the present invention.

Although this invention has been described relative to specific insulating materials, conductive materials and apparatuses for depositing and etching these materials, it is not limited to the specific materials or apparatuses but only to their specific characteristics, such as conformal and non-conformal, and capabilities, such as depositing and etching, and other materials and apparatus can be substituted as is well understood by those skilled in the microelectronics arts after appreciating the present invention.

Unless explicitly stated otherwise, each numerical value and range should be interpreted as being approximate as if the word about or approximately preceded the value of the value or range.

Given the variety of embodiments of the present invention just described, the above description and illustrations show not be taken as limiting the scope of the present invention defined by the claims.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method of making a mask comprising:
providing a mask substrate;
forming a continuous unit cell on the mask substrate, the unit cell defining a first phase shift region on the mask substrate, wherein the unit cell comprises a center section and distinct extension sections, the extension sections are contiguous to and extend outwards from the center section, the distinct extension sections having a same width as the center section, wherein dimensions of the extension sections (extension dimensions) determine dimensions of a contact hole (contact hole dimensions) formed on a resist layer using the mask; and
the mask substrate abutting the unit cell defines a second phase shift region, wherein the first and second phase shift regions are out of phase.

2. The method of claim 1 wherein:
the first phase shift region has a 180 degree shift and the second phase shift region has a zero degree shift; or
the first phase shift region has a zero degree shift and the second phase shift region has a 180 degree shift.

3. The method of claim 1 wherein the unit cell has an orthogonal cross shape with the extension sections extending outwards from the center section.

4. The method of claim 1 wherein the unit cell has a T shape with three extension sections extending outwards from the center section.

5. The method of claim 1 wherein the unit cell has an orthogonal cross shape with the center section having a square shape and four distinct square shape rectangular sections extending outwards from the square center section, the center section and the rectangular sections have the same length sides.

6. The method of claim 1 wherein the extension sections have a minimum length between 70 and 200% of the width of the center section.

7. The method of claim 1 wherein the first phase shift region comprises a plurality of unit cells arranged in a row or column formation whereby contact holes are formed in a row or column formation under the center section.

8. The method of claim 1 wherein the unit cell comprises four distinct extension sections extending from sides of the center section.

9. The method of claim 1 wherein one of the first or second region is disposed in a trench portion of the mask substrate while the other of the first or second region is disposed on a surface portion of the mask substrate above the trench portion.

10. The method of claim 1 wherein the first region is disposed in a trench portion of the mask substrate while the second region is disposed on a surface portion of the mask substrate above the trench portion.

11. A method of making a mask comprising:
providing a mask substrate; and
disposing a continuous unit cell on the mask substrate, the continuous cell defining a first phase shift region of the mask substrate, wherein the unit cell comprises a center section and distinct extension sections which are contiguous to and extend from the center section, the distinct extension sections having a same width as the center section, wherein dimensions of the extension sections (extension dimensions) determine dimensions of a contact hole (contact hole dimensions) formed on a resist layer using the mask.

12. The method of claim 11 wherein the central and distinct extension sections comprise rectangular shaped portions.

13. The method of claim 12 wherein the unit cell comprises at least three distinct extension sections extending from at least three sides of the center section.

14. The method of claim 12 wherein the unit cell comprises four distinct extension sections extending from sides of the center section.

15. The method of claim 11 wherein the unit cell comprises at least three distinct extension sections extending from at least three sides of the center section.

16. The method of claim 11 wherein the unit cell comprises four distinct extension sections extending from sides of the center section.

17. The method of claim 11 wherein the unit cell comprises three distinct extension sections extending from at least three sides of the center section to form a T-shaped unit cell.

18. The method of claim 11 wherein the unit cell comprises four distinct extension sections extending from the center section to form a cross-shaped unit cell.

19. The method of claim 11 wherein the unit cell has an orthogonal cross shape with the center section having a square shape and four distinct square shape rectangular sections extending outwards from the square center section, the center section and the rectangular sections have the same length sides.

20. The method of claim 11 wherein the extension sections have a minimum length between 70 and 200% of the width of the center section.

21. The method of claim 11 wherein the first phase shift region comprises a plurality of unit cells arranged in a row or column formation whereby contact holes are formed in a row or column formation under the center section.

22. The method of claim 11 wherein the first region is disposed in a trench portion of the mask substrate.

23. A mask comprising:
a mask substrate;
a continuous unit cell disposed in a first phase shift region, wherein the unit cell comprises a center section and distinct extension sections which are contiguous to and extend from the center section, the distinct extension sections having a same width as the center section, wherein dimensions of the extension sections (extension dimensions) determine dimensions of a contact hole (contact hole dimensions) formed on a resist layer using the mask; and
a second phase shift region abutting the unit cell in the first phase shift region, the first and second phase shift regions are out of phase.

24. The mask of claim 23 wherein one of the first or second region is disposed in a trench portion of the mask substrate while the other of the first or second region is disposed on a surface portion of the mask substrate above the trench portion.

25. The mask of claim 23 wherein the first region is disposed in a trench portion of the mask substrate while the second region is disposed on a surface portion of the mask substrate above the trench portion.

* * * * *